(12) United States Patent
Butcher et al.

(10) Patent No.: US 7,105,903 B2
(45) Date of Patent: Sep. 12, 2006

(54) METHODS AND STRUCTURES FOR ELECTRICAL COMMUNICATION WITH AN OVERLYING ELECTRODE FOR A SEMICONDUCTOR ELEMENT

(75) Inventors: Brian R. Butcher, Gilbert, AZ (US);
Gregory W. Grynkewich, Gilbert, AZ (US); Kelly W. Kyler, Mesa, AZ (US);
Kenneth H. Smith, Chandler, AZ (US);
Richard G. Williams, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/993,196

(22) Filed: Nov. 18, 2004

(65) Prior Publication Data

US 2006/0102970 A1    May 18, 2006

(51) Int. Cl.
*H01L 29/76*   (2006.01)
*H01L 29/94*   (2006.01)
*H01L 31/062*  (2006.01)
*H01L 31/113*  (2006.01)
*H01L 29/82*   (2006.01)
*H01L 43/00*   (2006.01)

(52) U.S. Cl. .................................. 257/421; 257/295

(58) Field of Classification Search ........ 257/421–427, 257/295
See application file for complete search history.

(56) References Cited

U.S. PATENT DOCUMENTS

| | | | |
|---|---|---|---|
| 6,153,443 A | 11/2000 | Durlam et al. | |
| 6,165,803 A | 12/2000 | Chen et al. | |
| 6,365,419 B1 | 4/2002 | Durlam et al. | |
| 6,485,989 B1 | 11/2002 | Signorini | |
| 6,531,389 B1 | 3/2003 | Shue et al. | |
| 6,577,529 B1 | 6/2003 | Sharma | |
| 6,717,215 B1 | 4/2004 | Fricke | |
| 6,788,570 B1 | 9/2004 | Kim | |
| 6,903,400 B1 * | 6/2005 | Kikuchi et al. | 257/295 |
| 6,909,129 B1 * | 6/2005 | Kim et al. | 257/295 |
| 2004/0063223 A1 | 4/2004 | Costrini et al. | |
| 2004/0106245 A1 | 6/2004 | Butcher et al. | |

\* cited by examiner

*Primary Examiner*—Cuong Nguyen
(74) *Attorney, Agent, or Firm*—Ingrassia, Fisher & Lorenz

(57) ABSTRACT

Structures for electrical communication with an overlying electrode for a semiconductor element and methods for fabricating such structures are provided. The structure for electrical communication with an overlying electrode comprises a first electrode having a lateral dimension, a semiconductor element overlying the first electrode, and a second electrode overlying the semiconductor element. The second electrode has a lateral dimension that is less than the lateral dimension of the first electrode. A conductive hardmask overlies the second electrode and is in electrical communication with the second electrode. The conductive hardmask has a lateral dimension that is substantially equal to the lateral dimension of the first electrode. A conductive contact element is in electrical communication with the conductive hardmask.

25 Claims, 5 Drawing Sheets

METHODS AND STRUCTURES FOR ELECTRICAL COMMUNICATION WITH AN OVERLYING ELECTRODE FOR A SEMICONDUCTOR ELEMENT

FIELD OF THE INVENTION

The present invention generally relates to magnetoelectronic devices, and more particularly relates to methods and structures for electrical communication with an overlying electrode for a magnetoelectronic element.

BACKGROUND OF THE INVENTION

Magnetoelectronic devices, spin electronics devices, and spintronics devices are synonymous terms for devices that use effects predominantly caused by electron spin. Magnetoelectronic effects are used in numerous information devices, and provide non-volatile, reliable, radiation resistant, and high-density data storage and retrieval. The numerous magnetoelectronic information devices include, but are not limited to, magnetic random access memory (MRAM), magnetic sensors, and read/write heads for disk drives.

Generally, a magnetoelectronic information device is constructed with an array of magnetoelectronic elements (e.g., giant magneto resistance (GMR) elements, magnetic tunnel junction (MTJ) elements, or magnetic sensors) that are separated by dielectric or other insulative material. The magnetoelectronic elements typically have a structure that includes ferromagnetic layers separated by a non-magnetic layer.

Typically, electrical connection to a magnetoelectronic element is made utilizing electrodes that overlie and underlie the element. Contact to the electrode overlying the magnetoelectronic element often is made utilizing a via that is created by etching a hole through a dielectric layer formed on the overlying electrode and depositing a conductive material in the hole. However, the creation of a via to the overlying electrode is challenging with present-day increases in aspect ratios. The overlying electrode typically defines the active portion of the magnetoelectronic element. Accordingly, to increase the number of magnetoelectronic elements in a given area, it is preferable to minimize the lateral dimensions of the magnetoelectronic element, and hence the lateral dimensions of the overlying electrode. However, as the dimensions of the overlying electrode decrease, the overlay tolerances of the via decrease and, thus, the difficulty of forming a via to the electrode increases. Decreases in overlay tolerances result in an increased number of shorted magnetoelectronic elements. In turn, this results in decreased yield and increased production costs. In addition, inherent stresses in the structure of the overlying electrode can adversely affect the magnetic properties of the magnetoelectronic element. Accordingly, it is preferably to make the overlying electrode as thin as possible. However, as the thickness of the overlying electrode decreases, the difficulty in making subsequent electrical contact to the electrode increases. Planarization to the overlying electrode often results in over-planarization past the overlying electrode.

Accordingly, it is desirable to provide an electronic structure for electrical communication with an overlying electrode for a magnetoelectronic element. It also is desirable to provide an efficient method for electrical communication with an overlying electrode for a magnetoelectronic element. In addition, it is desirable to extend use of this method to other structures in which electrical communication with an electrode is required. Furthermore, other desirable features and characteristics of the present invention will become apparent from the subsequent detailed description of the invention and the appended claims, taken in conjunction with the accompanying drawings and this background of the invention.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 1:
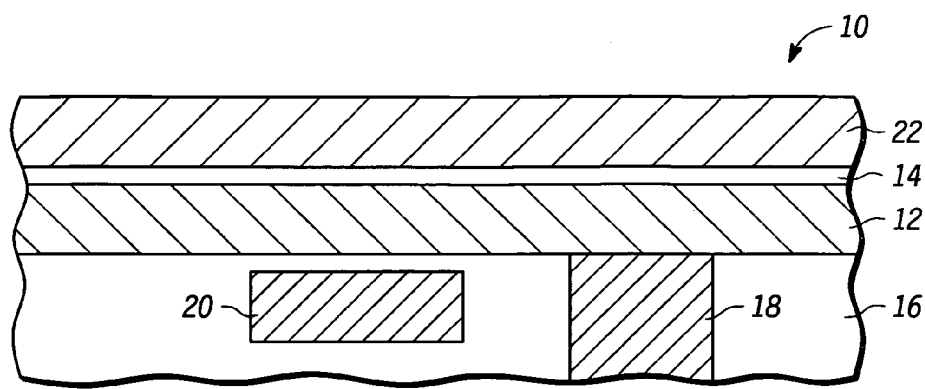
FIGS. 1–8 illustrate schematically, in cross section, a method for electrical communication with an overlying electrode for a magnetoelectronic element in accordance with an exemplary embodiment of the present invention.

Turning now to the figures, FIGS. 1–8 illustrate a method for establishing electrical communication with an electrode overlying a magnetoelectronic element in accordance with one exemplary embodiment of the present invention. It should be understood that, while only a single magnetoelectronic element is illustrated for convenience, generally a complete array of magnetoelectronic elements will be formed simultaneously to form an MRAM device. FIG. 1 is a cross-sectional view of a partially fabricated magnetoelectronic element structure 10 of an MRAM device. As illustrated in FIG. 1, the partially fabricated magnetoelectronic element structure 10 comprises a first electrode layer 12 that underlies a magnetoelectronic element 14. As used herein, the term "layer" means one layer or a combination or plurality of layers or sub-layers. Magnetoelectronic element 14 may be a giant magnetoresistance (GMR) element or a magnetic tunnel junction (MTJ) element that comprises ferromagnetic layers separated by a non-magnetic layer. First electrode layer 12 may comprise any suitable electrically conductive material, such as an electrically conductive polymer or combination of polymers or a metal, as illustrated in FIGS. 1–8, or combinations of metals. Preferably, first electrode layer 12 is formed of tantalum (Ta), tungsten (W), titanium (Ti), aluminum (Al), tantalum nitride (TaN), or combinations or alloys thereof. First electrode layer 12 is formed overlying a dielectric region 16 within which has been formed a conductor 18. Conductor 18 may comprise any suitable conductive material, such as aluminum (Al), aluminum alloys, copper (Cu), copper alloys, and the like. While not shown, conductor 18 typically is electrically connected, such as by a plug conductor or a series of conductors in an interconnect stack, to a transistor formed in a semiconductor substrate, such as a silicon substrate. The transistors are used to access the contents of the magnetoelectronic elements in reading operations. In addition, dielectric region 16 may comprise a programming line 20, typically known as a digit line, which provides a magnetic field for programming of subsequently formed magnetoelectronic elements.

Partially fabricated magnetoelectronic element structure 10 further comprises a second electrode layer 22 that is formed overlying magnetoelectronic device 14. Second electrode layer 22 may be formed of any suitable electrically conductive material, such as a metal, as illustrated in FIG. 1, or a conductive polymer. Preferably, second electrode layer 22 is formed of tantalum (Ta), tungsten (W), titanium (Ti), aluminum (Al), tantalum nitride (TaN), or combinations or alloys thereof.

Figure 2:
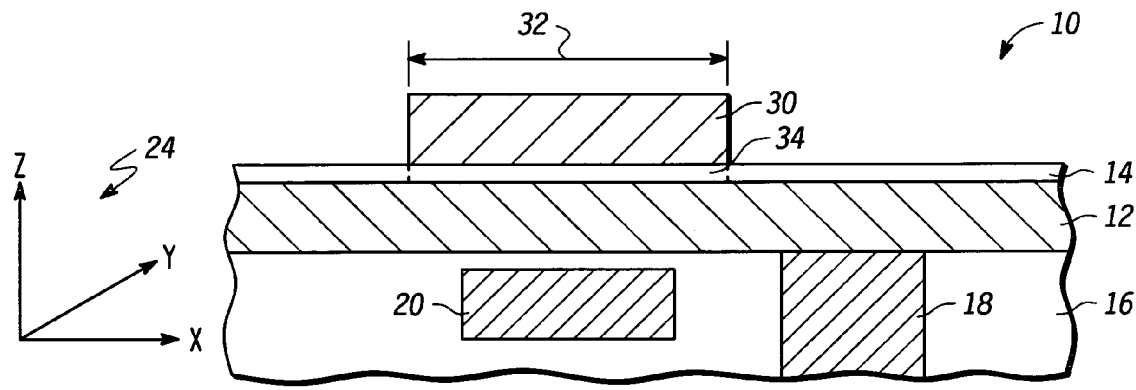

Referring to FIG. 2, second electrode layer 22 is patterned and etched, using one or more standard and well-known photolithography techniques, to form second electrode 30, which has lateral dimensions 32 that define the lateral dimension of an active region 34 of magnetoelectronic element 14. As used herein, the term "lateral dimensions" are those dimensions measured by x and y axes of a coordinate system 24 of FIGS. 2 and 3. It is preferable that active region 34, defined by second electrode 30, be positioned substantially overlying digit line 20 so that magnetic flux produced by current flowing through digit line 20 may be effectively imposed upon active region 34 for programming. Accordingly, conductor 18 within dielectric region 16 may be offset from second electrode 30.

Second electrode layer 22 may be etched using a suitable etching process, such as a dry etch, an ion milling process, reactive ion etching (RIE), wet etching, or the like. In addition, the etch preferably has a selectivity for the material(s) that form electrode layer 22. The etching of second electrode layer 22 may be terminated when second electrode layer 22 is substantially removed from those portions of magnetoelectronic element structure 10 that are not masked by the masking layer. The end point of the etching process may be monitored or determined using any suitable method, such as timing of the etch, endpoint detection devices, and the like. In one embodiment of the invention, one or more layers of magnetoelectronic element 14 may also be removed by etching during or after the etching of second electrode layer 22. It will be appreciated that, while the above describes formation of second electrode 30 using a subtractive process, second electrode 30 may be formed utilizing any other suitable process, such as, for example, a damascene process.

Figure 3:
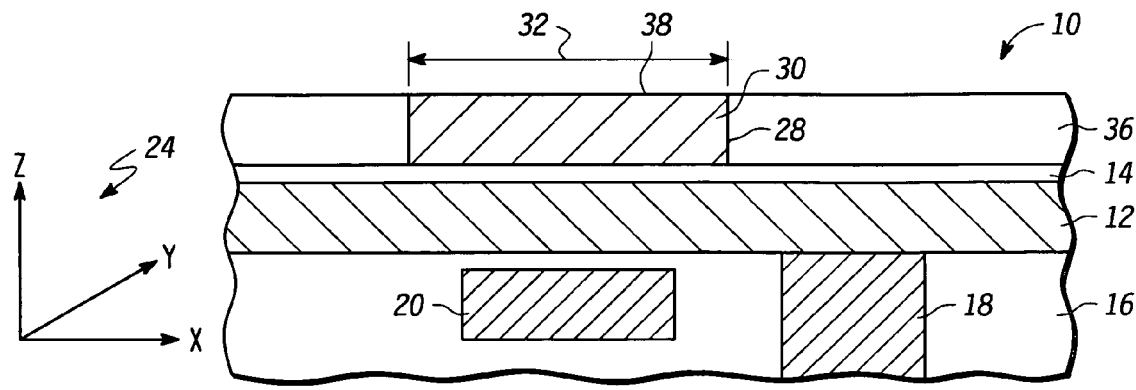

Referring to FIG. 3, a dielectric layer 36 then may be formed overlying first electrode layer 12 and any layers of magnetoelectronic element 14 that have not been otherwise removed during a previous etching process in a manner that substantially insulates sidewalls 28 of second electrode 30. As used herein, the term "sidewalls" of an element may refer to one sidewall, as when the element has a circular or oval shape, or may refer to more than one sidewall, as when the element has a triangular, square, rectantgular or other polygon shape. In one embodiment of the invention, dielectric layer 36 may be formed by the blanket deposition of any suitable dielectric material, such for example, tetraethyl orthosilicate-derived silicon dioxide (TEOS), plasma-enhanced-nitride (PEN), silicon nitride, silicon dioxide, and the like, over magnetoelectronic element structure 10. The dielectric material then may be subjected to a removal process, such as, for example, chemical-mechanical planarization, electrochemical-mechanical planarization, or an etching process, so that a surface 38 of second electrode 30 is exposed. In another embodiment of the invention, dielectric layer 36 may be formed by the deposition of spin-on-glass or other suitable dielectric in a manner that leaves surface 38 of second electrode 30 exposed and sidewalls 28 of second electrode 30 substantially insulated.

Figure 4:
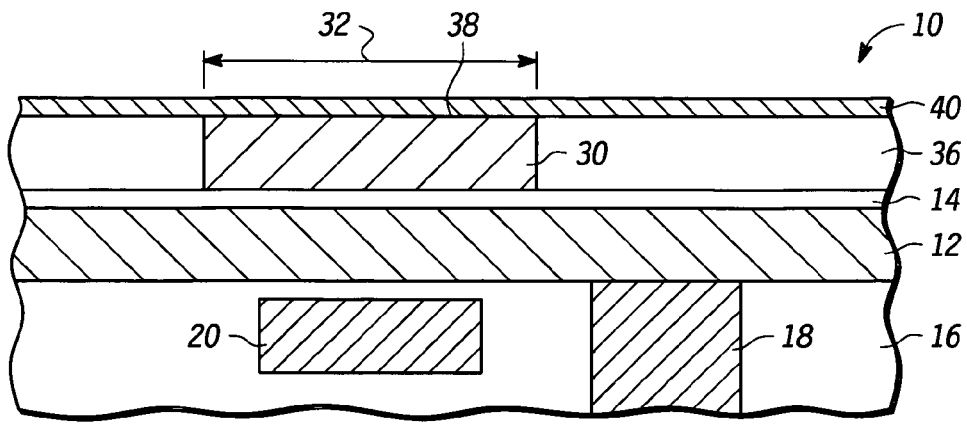

As illustrated in FIG. 4, a conductive hardmask layer 40 subsequently is deposited overlying dielectric material layer 36 and second electrode 30 such that conductive hardmask layer 40 is in electrical communication with second electrode 30. Conductive hardmask layer 40 may comprise any suitable conductive material, such as a metal, as illustrated in FIG. 4, or a conductive polymer and may be deposited using any process well-known in the semiconductor industry, such as, for example, plasma vapor deposition (PVD), chemical vapor deposition (CVD), and evaporation deposition. In a preferred embodiment of the invention, conductive hardmask layer 40 comprises aluminum. Conductive hardmask layer 40 may have any suitable thickness such that conductive hardmask layer 40 comprises an electrically conductive layer. In addition, as described in more detail below, hardmask layer 40 serves as a mask for the subsequent etching of first electrode 12 and, accordingly, has a thickness sufficient to withstand the subsequent etching process. Moreover, as described in more detail below, a programming line, typically referred to as a bit line, subsequently may be fabricated overlying magnetoelectronic element 14 and conductive hardmask layer 40. Thus, it will be appreciated that conductive hardmask layer 40 preferably is not so thick that it will significantly reduce the strength of the magnetic flux imposed on magnetoelectronic element 14 by current flowing through the bit line. Preferably, hardmask layer 40 has a thickness in a range of about 200 angstroms to about 400 angstroms.

Figure 5:
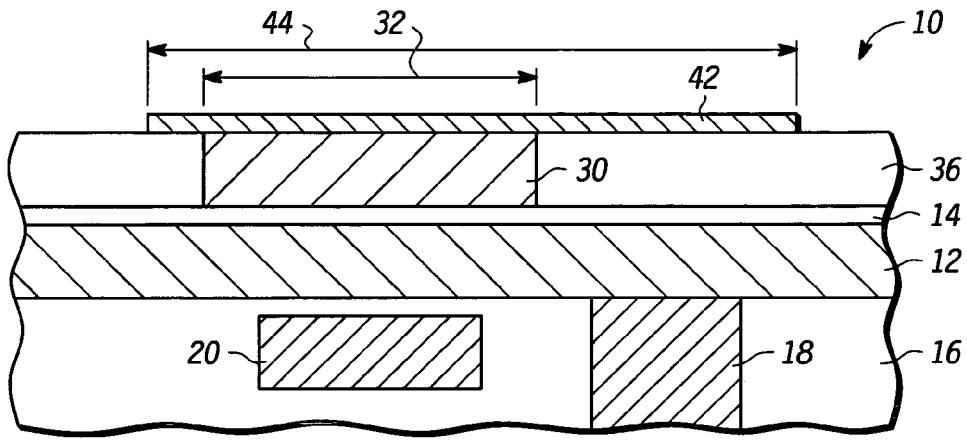
Figure 6:
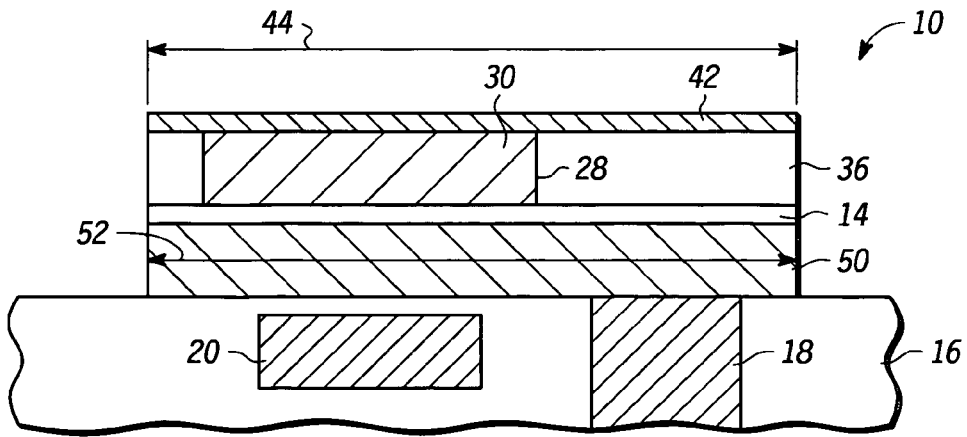
Figure 9:
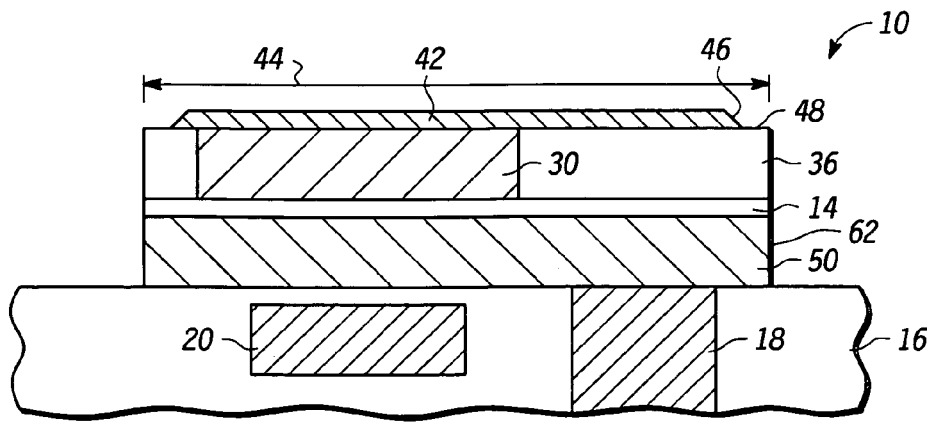
FIG. 9 is a cross-sectional view of a magnetoelectronic element structure formed in accordance with another exemplary embodiment of the present invention.

Referring to FIG. 5, after deposition, conductive hardmask layer 40 is patterned using standard and well-known techniques to form a conductive hardmask 42 having at least one lateral dimension 44 that is larger than the lateral dimension 32 of second electrode 30. Dielectric layer 36, first electrode layer 12, and magnetoelectronic element 14, or any remaining layers thereof, then are etched to remove the portions of dielectric layer 36, magnetoelectronic element 14, and first electrode layer 12 that do not underlie conductive hardmask 42. As illustrated in FIG. 6, the etching of first electrode layer 12 forms a first electrode 50 having at least one lateral dimension 52 that is substantially equal to the lateral dimension 44 of conductive hard mask 42. In this manner, as the lateral dimension 32 of second electrode 12 is smaller than the lateral dimension 44 of conductive hardmask 42 and, hence, the lateral dimension 52 of first electrode 50, the risk of a short between first electrode 50 and second electrode 30 across magnetoelectronic element 14 may be reduced or minimized. Dielectric layer 36, first electrode layer 12, and magnetoelectronic element 14, or selected layers thereof, may be etched using any suitable and well-known etching process or series of etching processes, such as dry etching, sputtering, RIE, or any other etching process(es) that does not result in electrical contact between conductive hardmask 42 and first electrode 50. The etching of first electrode layer 12 may be terminated when first electrode layer 12 is substantially removed from those portions of magnetoelectronic element structure 10, i.e., dielectric region 16, that do not underlie the conductive hardmask 42. The end point of the etching process may be monitored or determined using any suitable method, such as timing of the etch, endpoint detection devices, and the like. In one embodiment of the invention, no portion of conductive hardmask 42 is significantly removed during the etch of dielectric layer 36, magnetoelectronic element 14, and first electrode layer 12. In another embodiment of the invention, as illustrated in FIG. 9, to ensure that electrical contact between sidewalls 46 of conductive hardmask 42 and sidewalls 62 of first electrode 50 does not result, conductive hardmask 42 may be etched before, during, or after the etch or etches of dielectric layer 36, magnetoelectronic element 14, and first electrode layer 12 so that conductive hardmask 42 has substantially sloping or beveled sidewalls 46.

Figure 7:
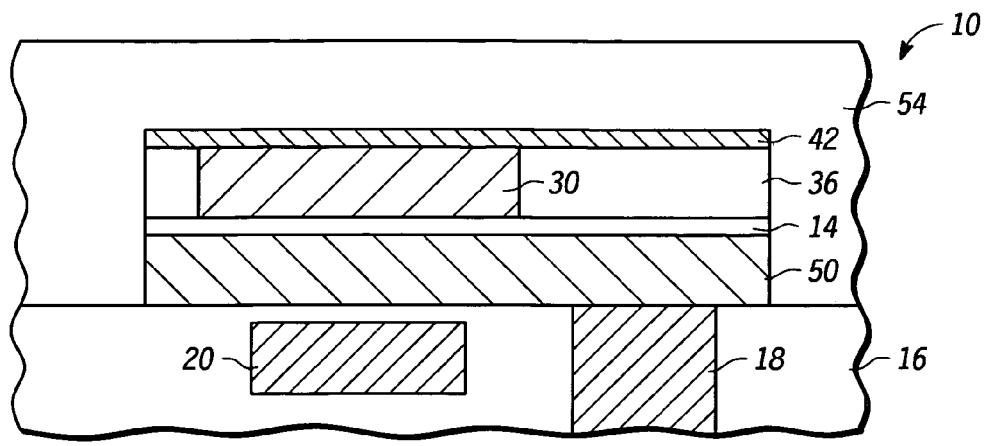
Figure 8:
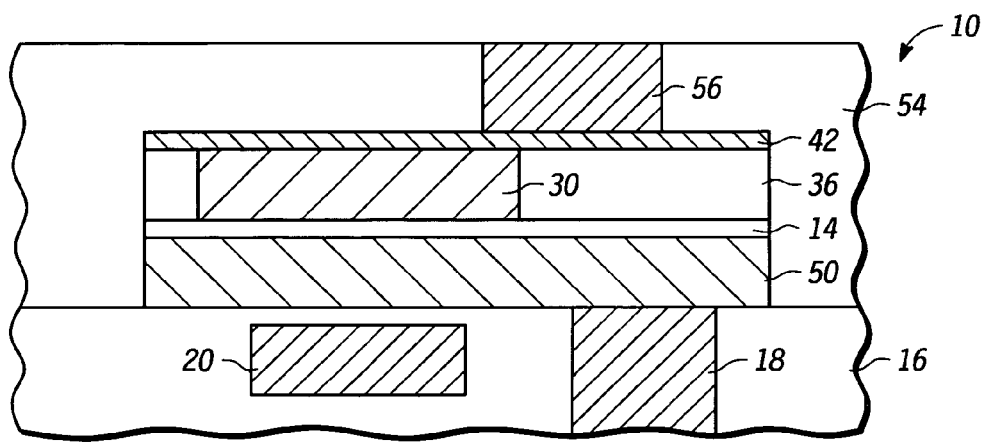

Referring now to FIG. 7, in one embodiment of the present invention, after etching first electrode layer 12 to form first electrode 50, a dielectric layer 54 then may be deposited overlying magnetoelectronic element structure 10. Dielectric layer 54 may be formed by the blanket deposition of any suitable dielectric material, such for example, tetraethyl orthosilicate-derived silicon dioxide (TEOS), plasma-enhanced nitride (PEN), silicon nitride, silicon dioxide, spin-on-glass, and the like over magnetoelectronic element structure 10. Referring to FIG. 8, a via 56 then may be formed within dielectric layer 54 by first etching a hole in dielectric layer 54 to conductive hard mask 42 and then filling the hold with a suitable conductive material, as is well-known in the semiconductor industry. As will be appreciated, via 56 also may be formed by other suitable methods such as by subtractive methods that are well-known in the art. Upon formation of via 56, a conductor (not shown), such as an interconnect line or a bit line, may be fabricated using any suitable, well-known method in the semiconductor industry such that the conductor is in electrical communication with via 56.

Figure 10:
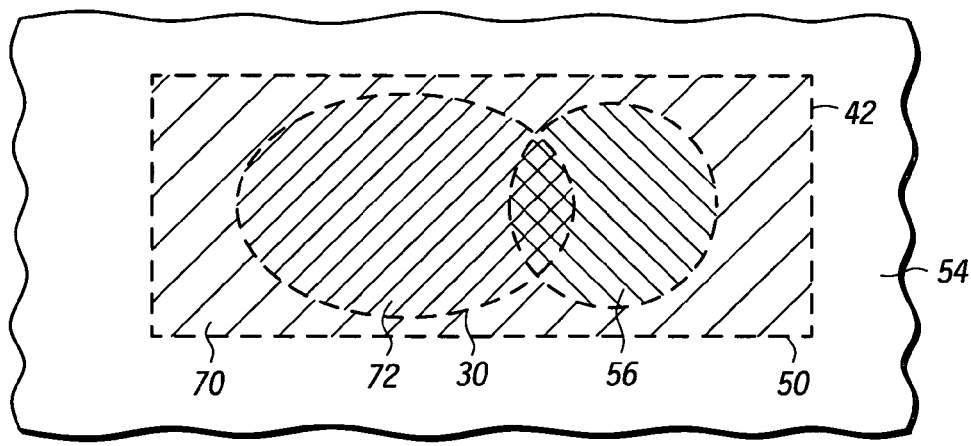
FIG. 10 is a top view of a magnetoelectronic element structure, with a second electrode shown in phantom, formed utilizing the methods illustrated in FIGS. 1–8.

Accordingly, referring now to FIGS. 8 and 10, via 56 may be configured to provide electrical communication to second electrode 30 by utilizing conductive hardmask 42, which provides a contact area 70 that is larger than the contact area 72 of second electrode 30 without increasing the lateral dimension(s) of the magnetoelectronic element structure 10. In this manner, the overlay tolerances for forming via 56 for electrical communication with second electrode 30, and thus magnetoelectronic element 14, may be greater because conductive hardmask 42 provides a surface area 70 larger than that of second electrode 30 upon which via 56 may land. Accordingly, the dimensions of second electrode 30, and hence magnetoelectronic element 14, may be smaller than would be required without utilization of conductive hardmask 42. Alternatively, the dimensions of via 56 may be larger than would be required without utilization of conductive hardmask 42.

Figure 11:
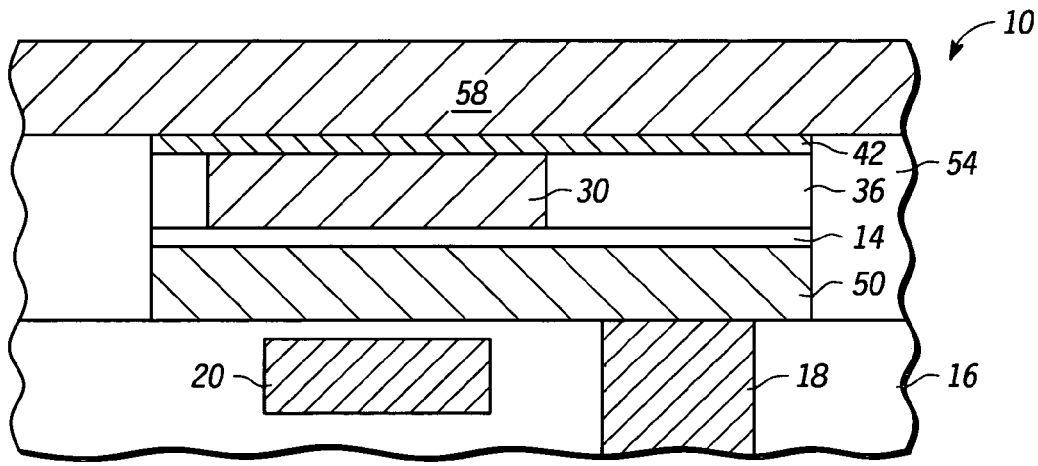
FIG. 11 is a cross-sectional view of a magnetoelectronic element structure formed in accordance with a further exemplary embodiment of the present invention.

In an alternative embodiment of the present invention, after deposition of dielectric layer 54, as illustrated in FIG. 7, a trench (not shown) may be formed in dielectric layer 54 orthogonal to digit line 20 and exposing conductive hardmask 42. As illustrated in FIG. 11, a conductor 58, such as, for example, a bit line or other interconnect line, then may be formed within the trench and in electrical communication with conductive hardmask 42. It will be appreciated that conductor 58 also could be fabricated using any other suitable, well-known technique, such as, for example, a subtractive method. In this regard, if the conductor 58 is a bit line, the bit line can be formed closer to the magnetoelectronic element 14 than if a via was first formed, thus increasing the magnetic flux imposed on magnetoelectronic element 14 from current flowing through the bit line. An increase in the magnetic flux imposed on the magnetoelectronic element 14 in turn may decrease the current required to program magnetoelectronic element 14.

Figure 12:
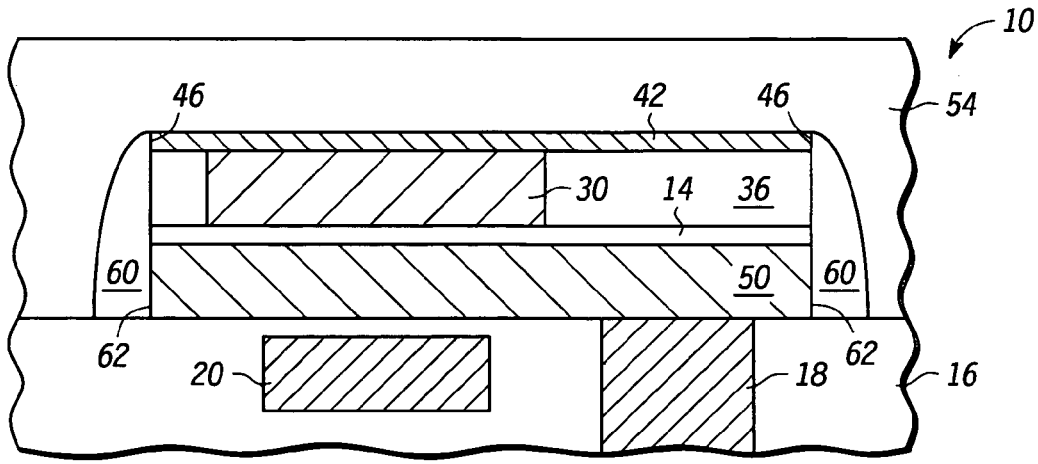
FIG. 12 is a cross-sectional view of a magnetoelectronic element structure formed in accordance with yet another exemplary embodiment of the present invention.

Referring to FIG. 12, in another embodiment of the invention, before the deposition of dielectric material layer 54, spacers 60 may be formed about the sidewalls 62 of first electrode 50 to facilitate insulation of conductive hardmask 42 from first electrode 50. The spacers 60 may extend the length of the sidewalls 62 of first electrode 50 and may also extend the length of sidewalls 46 of conductive hardmask 42, as shown in FIG. 12. The spacers 60 may be formed of any suitable insulating material, such as those materials described above for the fabrication of dielectric material layer 36 and/or dielectric material layer 54, and may be formed using any conventional method. For example, a dielectric layer may be formed by the blanket deposition of any suitable dielectric material, such for example, tetraethyl orthosilicate-derived silicon dioxide (TEOS), plasma-enhanced nitride (PEN), silicon nitride, silicon dioxide, spin-on-glass, and the like, over magnetoelectronic element structure 10. The dielectric layer then may be subjected to a suitable dry or wet etch to form spacers 60. After formation of spacers 60, dielectric material layer 54 may be deposited overlying magnetoelectronic element structure 10 and a via, such as via 56 of FIG. 8, or a conductor, such as conductor 58 of FIG. 11, then may be formed as described above.

Figure 13:
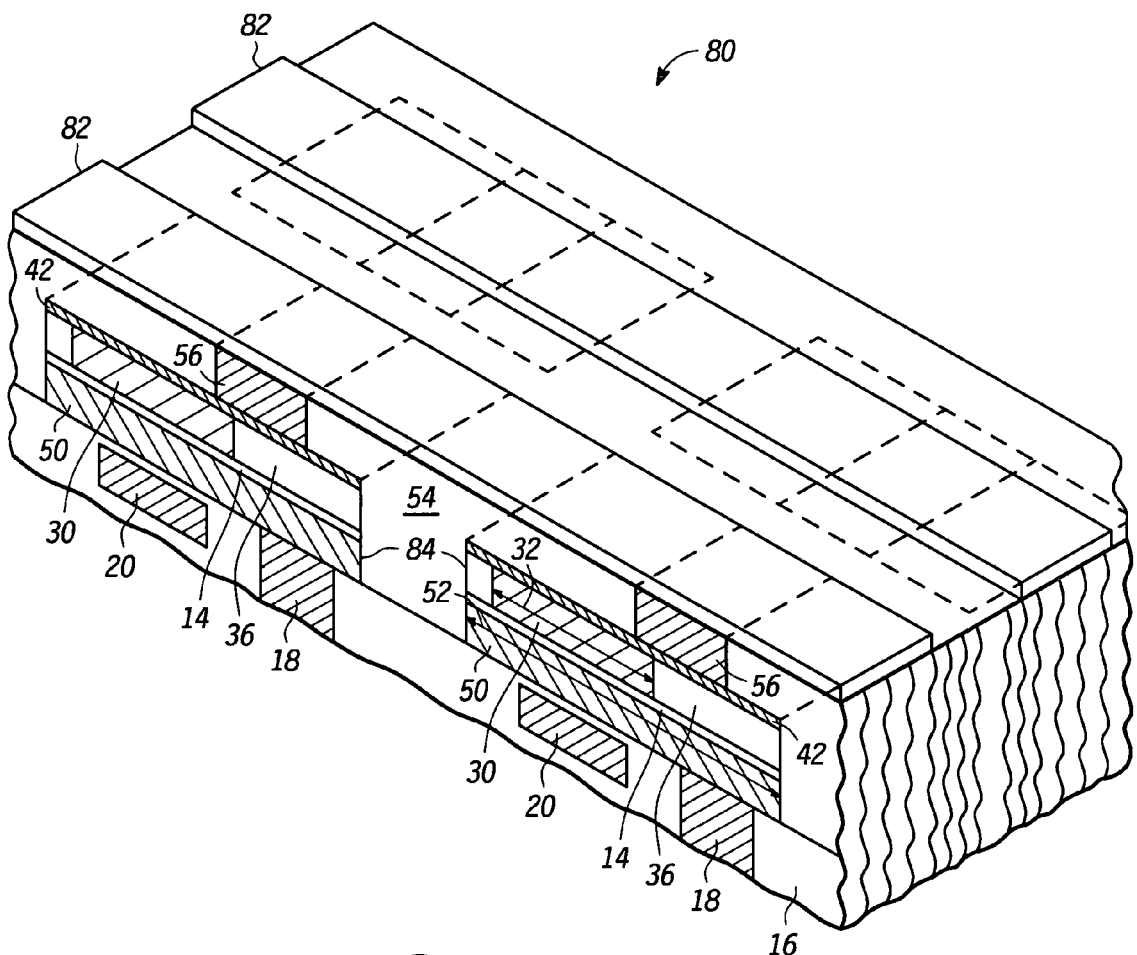
FIG. 13 is an enlarged perspective view of a portion of a random access memory device in accordance with an exemplary embodiment of the present invention.

FIG. 13 illustrates an enlarged perspective view of a portion of a random access memory device 80 in accordance with another exemplary embodiment of the present invention. Elements of FIG. 13 that have the same reference numbers as FIG. 8 are the same as the corresponding FIG. 8 elements. Random access memory device 80 includes a plurality of magnetic memory units 84 that are each electrically coupled to a metal contact layer 82. The magnetic memory units 84 may be formed on any suitable dielectric region 16, which may include any suitable semiconductor devices (not shown) such as, for example, switching transistors, bit and/or data lines, input/output circuits, data/address decoders, and the like, and also may comprise conductors 18 that electrically couple the magnetic memory units 84 to transistors used to access the contents of the magnetic memory units in reading operations. Programming lines, such as digit lines 20, may also be disposed within dielectric region 16.

Each magnetic memory unit 84 includes a first electrode 50 and a magnetoelectronic element 14 overlying first electrode 50. A second electrode 30 overlies magnetoelectronic element 14 and defines the active region of magnetoelectronic element 14. Second electrode 30 has at least one lateral dimension 32 that is smaller than a lateral dimension 52 of first electrode 50. A conductive hardmask 42 overlies second electrode 30 and first electrode 50 and has substantially the same lateral dimensions as first electrode 50. Conductive hardmask 40 provides a larger contact area for a via 56 than does second electrode 30 without increasing the lateral dimension(s) of magnetic memory units 84.

Figure 14:
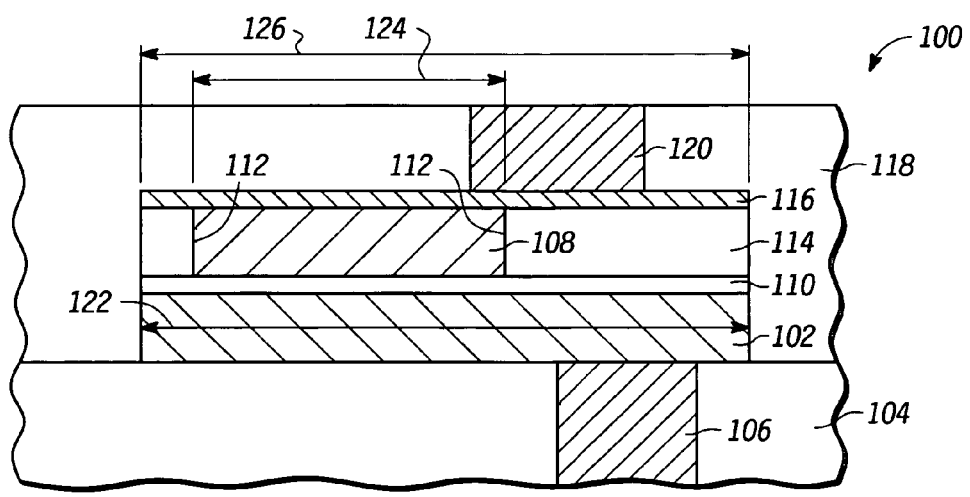
FIG. 14 is a cross-sectional view of an electronic structure in accordance with an exemplary embodiment of the present invention.

It will be appreciated that the principles of the present invention are not limited to magnetoelectronic structures but may also be used for contacting an electrically conductive first electrode overlying any suitable semiconductor element or structure that separates the first electrode from an underlying second electrode. In accordance with another exemplary embodiment of the present invention, FIG. 14 illustrates an electronic structure 100 formed using the various embodiments described above. Electronic structure 100 may comprise a capacitive structure or any other structure that utilizes conductive electrode layers separated by a semiconductor element, such as a magnetoelectronic element, an insulating material layer or layers, or any other suitable semiconductor device or material layer.

In one embodiment, structure 100 includes a first electrode 102 that is formed overlying a substrate 104 and that has at least one lateral dimension 122. Substrate 104 may comprise a dielectric material within which has been formed a conductor 106. Conductor 106 may comprise any suitable conductive material, such as aluminum (Al), aluminum alloys, copper (Cu), copper alloys, and the like. While not shown, conductor 106 may be electrically connected, such as by a plug conductor or a series of conductors in an interconnect stack, to a transistor or other electronic device or power source formed in a semiconductor substrate, such as a silicon substrate. In an alternative embodiment of the invention, first electrode 102 may be formed overlying any other suitable substrate or material, such as conductive material, or any suitable electronic device.

In one exemplary embodiment of the invention, structure 100 also includes an at least semi-insulating material layer 110, such as an oxide or nitride material, and a second electrode 108 overlying the at least semi-insulating material layer 110. Second electrode 108 has at least one lateral dimension 124 that is smaller than lateral dimension 122 of first electrode 102. Utilizing any of the embodiments of the method described above with reference to FIGS. 1–8, second electrode 108 is substantially surrounded at its sidewalls 112 by a dielectric material 114. A conductive hardmask 116 is disposed overlying dielectric material 114 and overlies and is in electrical communication with second electrode 108. Conductive hardmask 116 has at least one lateral dimension 126 that is substantially equal to lateral dimension 122 of first electrode 102. Conductive hardmask 116 may comprise of any of the materials used to form conductive hardmask 42 with reference to FIG. 4. A dielectric material layer 118 may be disposed at the sidewalls of conductive hardmask 116 and first electrode 102 and may insulate conductive hardmask 116 from first electrode 102. Dielectric material layer 118, or another dielectric material layer, also may overlie conductive hardmask layer 116. Conductive hardmask 116 may be in electrical communication with a via 120 or other conductor (not shown) formed overlying conductive hardmask 116 using any of the methods described above for forming via 56 or conductor 58 of FIGS. 8 and 11.

Accordingly, methods and structures for electrical communication with an electrode overlying a semiconductor element have been described. The methods and structures utilize a conductive hardmask that provides a contact area (for a via or other conductor) that is larger than the contact area of the overlying electrode without increasing the lateral dimension(s) of the semiconductor element. While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

What is claimed is:

1. A structure for electrical communication with an electrode overlying a semiconductor clement, the structure comprising:
    a first electrode having a first lateral dimension;
    a separating semiconductor element overlying said first electrode;
    a second electrode overlying said separating semiconductor element, said second electrode having a second lateral dimension that is less than said first lateral dimension of said first electrode;
    a conductive hardmask overlying said second electrode and in electrical communication with said second electrode, said conductive hardmask having a third lateral dimension that is substantially equal to said first lateral dimension of said first electrode; and
    a conductive contact clement in electrical communication with said conductive hardmask.

2. The structure for electrical communication with an electrode overlying a semiconductor element of claim 1, wherein said semiconductor element comprises a magnetoelectronic element.

3. The structure for electrical communication with an electrode overlying a semiconductor element of claim 2, said magnetoelectronic element comprising a magnetic tunnel junction element.

4. The structure for electrical communication with an electrode overlying a semiconductor element of claim 2, said magnetoelectronic element comprising a giant magnetoresistance element.

5. The structure for electrical communication with an electrode overlying a semiconductor element of claim 2, said conductive contact element comprising a bit line.

6. The structure for electrical communication with an electrode overlying a semiconductor element of claim 5, said structure further comprising a digit line disposed underlying said first electrode and said second electrode.

7. The structure for electrical communication with an electrode overlying a semiconductor element of claim 1, said conductive contact element comprising a conductive via.

8. The structure for electrical communication with an electrode overlying a semiconductor element of claim 1, said conductive hardmask having at least one beveled sidewall.

9. The structure for electrical communication with an electrode overlying a semiconductor element of claim 1, said conductive hardmask and said first electrode each having at least one sidewall, wherein the structure further comprises a dielectric layer disposed proximate to said sidewall of said conductive hardmask and said sidewall of said first electrode.

10. The structure for electrical communication with an electrode overlying a semiconductor element of claim 1, said first electrode having at least one sidewall and said structure further comprising a spacer disposed proximate to said sidewall of said first electrode.

11. The structure for electrical communication with an electrode overlying a semiconductor element of claim 10, said conductive hardmask have at least one sidewall, wherein said spacer is disposed proximate to said sidewall of said conductive hardmask.

12. The structure for electrical communication with an electrode overlying a semiconductor element of claim 1, said conductive hardmask comprising a metal.

13. The structure for electrical communication with an electrode overlying a semiconductor element of claim 1, wherein said semiconductor element comprises an at least semi-insulating material layer.

14. The structure for electrical communication with an electrode overlying a semiconductor element of claim 13, wherein said first electrode, said at least semi-insulating material layer, and said second electrode comprise a capacitive device.

15. A random access memory device having a plurality of magnetic memory units, each magnetic memory unit comprising:
   a first electrode having a first lateral dimension, said first electrode in electrical communication with a transistor;
   a magnetoelectronic element overlying said first electrode and in electrical communication with said first electrode;
   a second electrode overlying said magnetoelectronic element and in electrical communication with said magnetoelectronic element, said second electrode having a second lateral dimension that is less than said first lateral dimension of said first electrode;
   a conductive hardmask layer overlying said second electrode and in electrical communication with said second electrode, said conductive hardmask layer having a third lateral dimension that is substantially equal to said first lateral dimension of said first electrode; and
   a conductive contact element in electrical communication with said conductive hardmask layer.

16. The random access memory device of claim 15, said magnetoelectronic element comprising a magnetic tunnel junction element.

17. The random access memory device of claim 15, said magnetoelectronic element comprising a giant magnetoresistance element.

18. The random access memory device of claim 15, said conductive contact element comprising a bit line.

19. The random access memory device of claim 15, said structure further comprising a digit line disposed underlying said first electrode and said second electrode.

20. The random access memory device of claim 15, said conductive contact element comprising a via in electrical communication with a conductor.

21. The random access memory device of claim 15, said conductive hardmask having at least one beveled sidewall.

22. The random access memory device of claim 15, said conductive hardmask and said first electrode each having at least one sidewall, wherein the structure further comprises a dielectric layer disposed proximate to said sidewall of said conductive hardmask and said sidewall of said first electrode.

23. The random access memory device of claim 15, said first electrode having at least one sidewall and said structure further comprising a spacer disposed proximate to said sidewall of said first electrode.

24. The random access memory device of claim 23, said conductive hardmask have at least one sidewall, wherein said spacer is disposed proximate to said sidewall of said conductive hardmask.

25. The random access memory device of claim 15, said conductive hardmask comprising a metal.

\* \* \* \* \*